(12) United States Patent
De Bruijn

(10) Patent No.: US 9,066,437 B2
(45) Date of Patent: Jun. 23, 2015

(54) ELECTRONIC MODULE

(75) Inventor: Jeroen De Bruijn, Loon op zand (NL)

(73) Assignee: FCI, Guyancourt (FR)

( * ) Notice: Subject to any disclaimer, the term of this patent is extended or adjusted under 35 U.S.C. 154(b) by 0 days.

(21) Appl. No.: 13/980,399

(22) PCT Filed: Jan. 18, 2012

(86) PCT No.: PCT/EP2012/050731
§ 371 (c)(1),
(2), (4) Date: Aug. 19, 2013

(87) PCT Pub. No.: WO2012/098168
PCT Pub. Date: Jul. 26, 2012

(65) Prior Publication Data
US 2013/0330045 A1   Dec. 12, 2013

(51) Int. Cl.
| G02B 6/36 | (2006.01) |
| G02B 6/42 | (2006.01) |
| H05K 7/12 | (2006.01) |
| H05K 9/00 | (2006.01) |
| G02B 6/38 | (2006.01) |

(52) U.S. Cl.
CPC ................ *H05K 7/12* (2013.01); *G02B 6/4292* (2013.01); *H05K 9/0058* (2013.01); *G02B 6/3807* (2013.01)

(58) Field of Classification Search
CPC ....... H05K 7/12; H05K 9/0058; G02B 6/3807
See application file for complete search history.

(56) References Cited

U.S. PATENT DOCUMENTS

| 6,178,096 | B1  | 1/2001 | Flickinger et al. ............ 361/816 |
| 7,108,523 | B2* | 9/2006 | Hartman ....................... 439/157 |
| 2005/0148223 | A1 | 7/2005 | Shirk et al. .................... 439/160 |
| 2010/0067199 | A1 | 3/2010 | Chen ............................. 361/747 |

FOREIGN PATENT DOCUMENTS

WO   WO 2006/105515 A1   10/2006

* cited by examiner

*Primary Examiner* — Omar R Rojas
(74) *Attorney, Agent, or Firm* — Harrington & Smith

(57) ABSTRACT

Electronic module, such as a small footprint pluggable (SFP) connector module, including a housing, an electroconductive cage for shielding the module and a latch for the cage to the housing. The latch includes a separate latch member accommodated between the housing and the cage, and at least one resiliently protruding tip. The cage is provided with an opening for receiving the resiliently protruding tip.

12 Claims, 3 Drawing Sheets

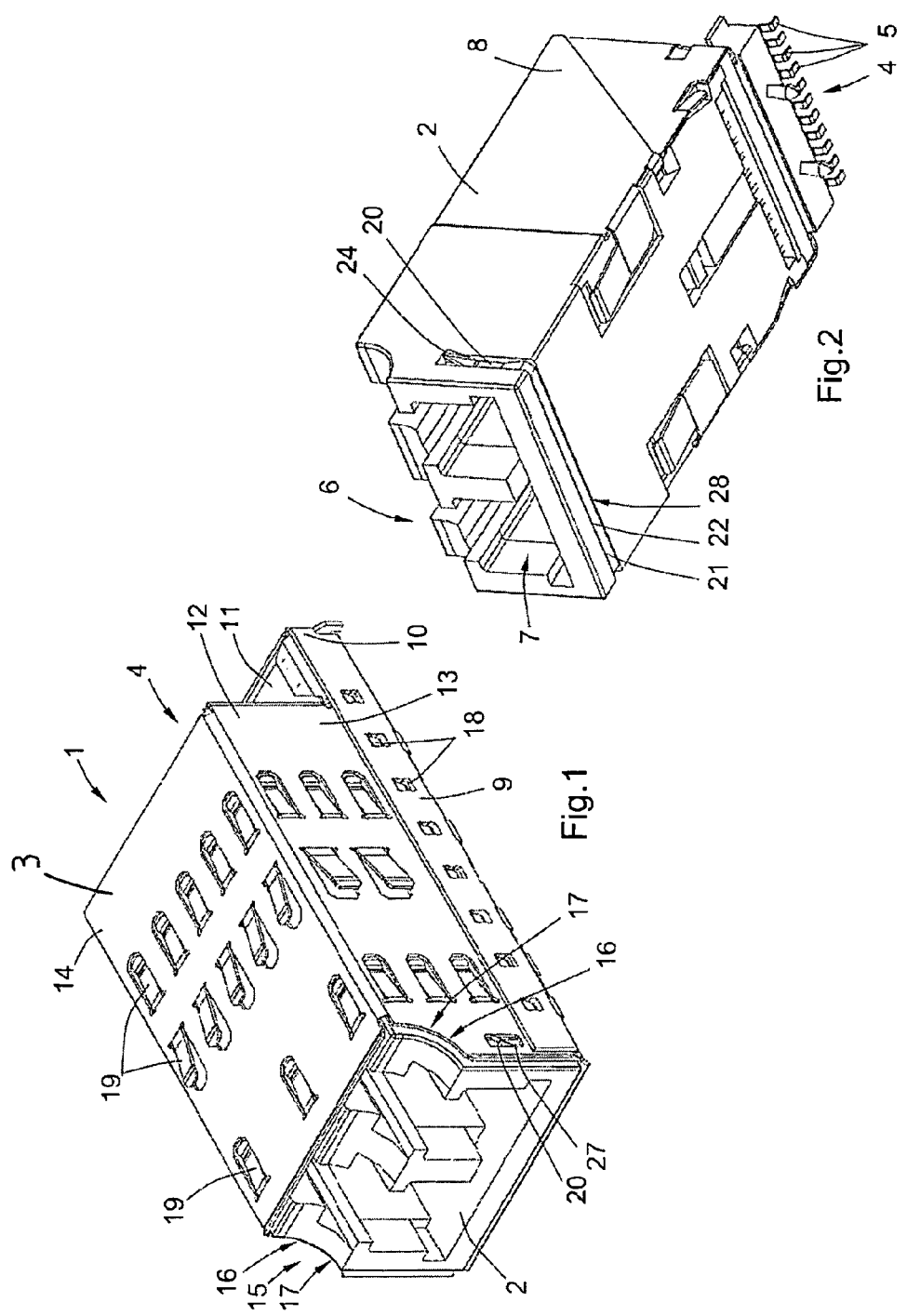

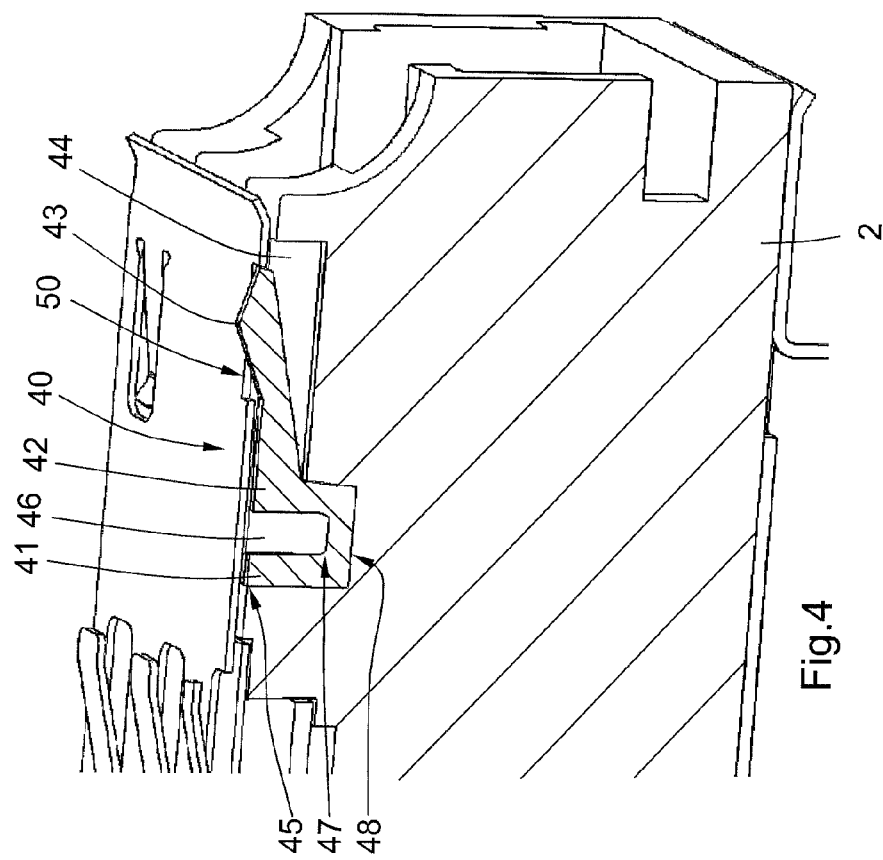
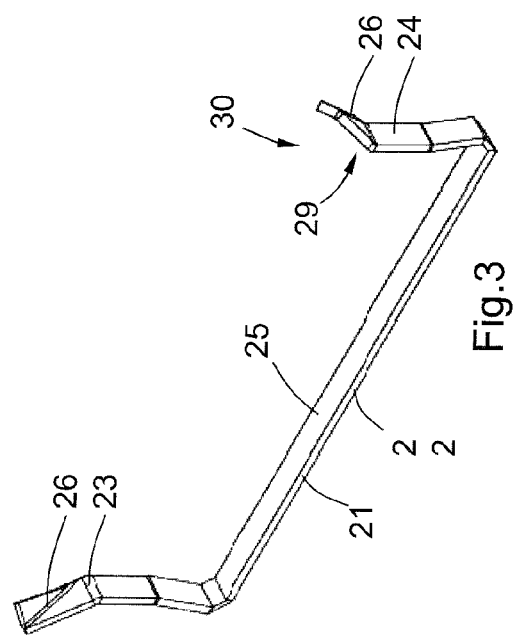

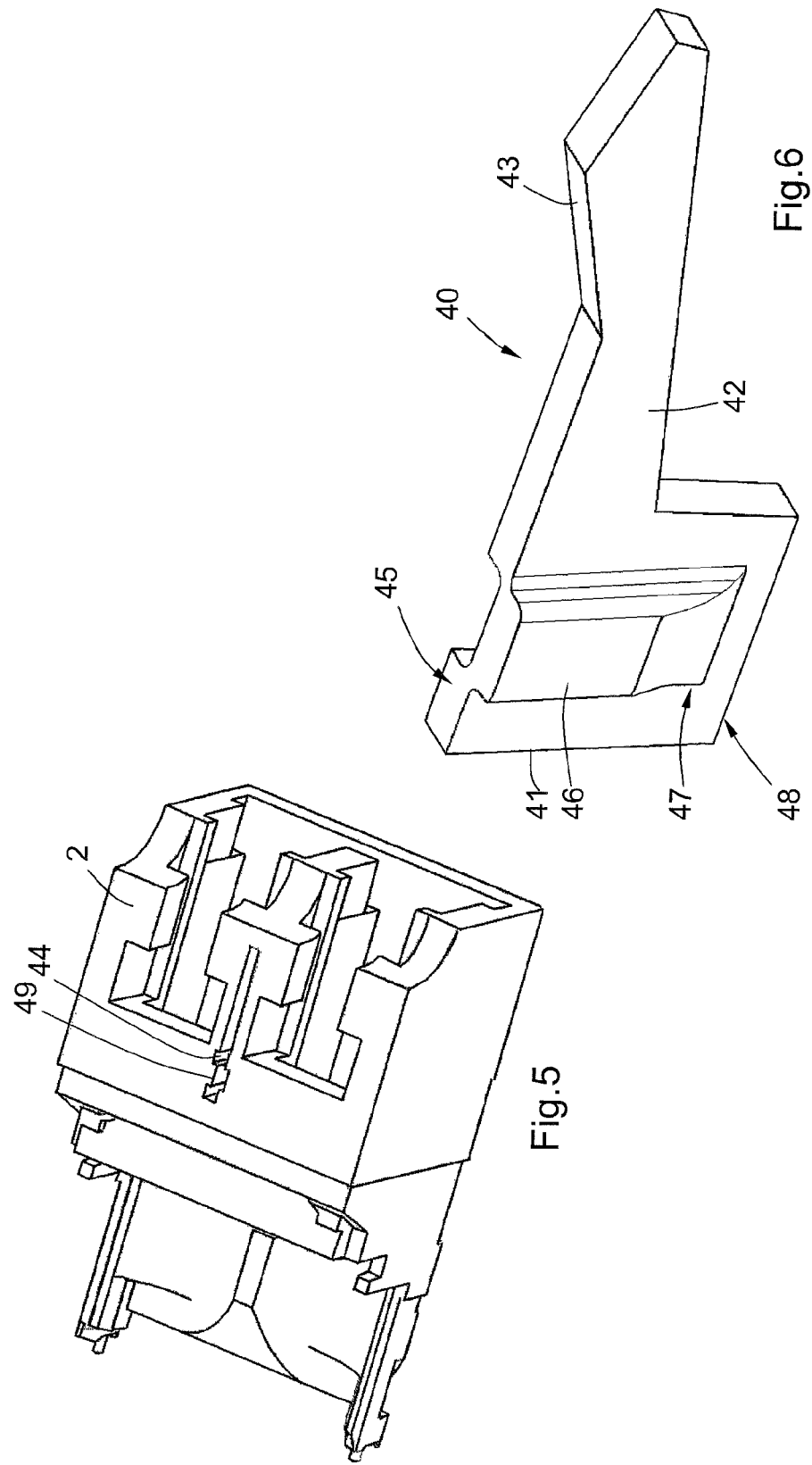

ELECTRONIC MODULE

FIELD OF THE INVENTION

The present invention relates to electronic or optoelectronic modules, such as pluggable transceiver modules for high speed fiber optical communications and pluggable electronic modules shielded by a cage fixated by a latch mechanism.

BACKGROUND OF THE INVENTION

Electronic modules, such as optoelectronic transceivers, are available which can be plugged on a printed circuit board (PCB). Particular examples are so-called Small Form-Factor Pluggable (SFP) transceivers, such as SFP's of the small cubic form factor (SCFF) type. Such transceivers are typically mounted on a PCB and can be shielded against electromagnetic interference by a cage of an electro-conductive material. Such a cage can be mounted onto the housing of the electronic module using a latch mechanism.

There is a need for a module having an easily accessible latch mechanism for a releasable coupling of the module within the cage. The latch mechanism should be easy to manufacture, assemble and operate and show a low failure rate with repetitive use.

SUMMARY OF THE INVENTION

In a first aspect of the invention a module is provided according to claim 1. Such a separate latch member can be manufactured against low costs and can form a very effective latch for coupling the module to the cage in a releasable manner.

In a module according to claim 2 or 3 the latch member is particularly stably held between the housing and the cage.

In a module according to claim 3 the upper face of the cage can be kept free, e.g., for use of one or more additional spring leaf ground contacts or tabs.

The latch member may be particularly easy and inexpensive to manufacture. The strip can efficiently be made, e.g., by punching and subsequent bending sheet material. The latch member can for instance be L-shaped, having only one bent resilient end, or it can be U-shaped, having two opposite resilient bent ends.

In an example module the twisted tips are more easily accessible for a user via the respective openings in the cage. By twisting the tips, one lateral side edge will protrude further away from the housing than the opposite lateral side edge of the tip. If the tip is twisted such that the lateral side edge directed to the open side of the cage is twisted outwardly it will more effectively lock the housing within the cage.

In a further aspect a module is provided, enabling another effective snap fit between the housing and the cage using a member which can be manufactured against low costs. Such a member can advantageously be made wherein the latch member is kept in place in the cavity in housing with a tight fit.

In an example module the metal latch member shields the opening in the cage, so the shielding by the cage is riot significantly interrupted by the openings.

The electronic module according to the invention is particularly useful as, e.g., a connector module, such as a small form factor pluggable (SFP) connector, e.g., SFP's of the small cubic form factor (SCFF) type.

BRIEF DESCRIPTION OF THE DRAWINGS

The present invention will be elucidated with reference to the figures wherein:

FIG. 1: shows in perspective view an embodiment of an electronic module according to the invention;

FIG. 2: shows a housing for the module of FIG. 1;

FIG. 3: shows a spring for a latch of the module of FIG. 1;

FIG. 4: shows in perspective cross section a further embodiment of an electronic module according to the invention;

FIG. 5: shows a perspective view of a housing of FIG. 4;

FIG. 6: shows in perspective view a latch member of the module of FIG. 4.

DETAILED DESCRIPTION OF EMBODIMENTS

FIG. 1 shows connector module 1 forming an optoelectronic transceiver of the small cubic form factor (SCFF) type. The module 1 comprises a housing 2 shielded by a cage 3 of an electro-conductive sheet metal. The housing 2 is shown separately in FIG. 2 and comprises a rear end 4 with a number of pin contacts 5 and a front end 6 with a cavity 7 giving access to an optical port (not shown). The rear end 4 is shielded by a metal cover 8.

The cage 3 comprises a metal base plate 9 with two opposite upright side edges 10 and an upright rear edge 11. Clamped between the two side edges 10 is a top portion 12 of the cage 3 having two side walls 13, a top wall 14, a front wall (not shown) and an open end 15. At the open front end 15, the side walls have a corner 16 chamfered by an inwardly curved edge 17. The side edges 10 of the base plate 2 are provided with inwardly bent lips 18 for clamping the lower edge of the top portion 12. The top portion 12 is provided with inwardly bent lips 19 for contacting the housing 2 to form ground contacts.

The housing 2 is inserted into the cage 3 with the rear end 4 abutting the rear wall of the cage 3. The rear wall leaves an opening (not shown) for the pin contacts 5. The upper edge of the front end. 6 of the housing 2 is chamfered in a way corresponding to the corners 16 of the side walls 13 of the cage 3.

A latch 20 holds the housing 2 within the cage 3. The latch 20 comprises a latch member 21, shown in FIG. 3. The latch member 21 comprises a metal strip 22 with two ends 23, 24 bent under an angle of more than 90 degrees. The two ends 23, 24 are linked by a middle section 25 spanning a distance corresponding to the width of the housing 2. The two ends 23, 24 have a terminal tip 26 which is bent backwards and twisted. Near the open end 15 the side wails 13 of the cage 3 have an opening 27 for receiving one of the terminal tips 26 of the latch member 21. At its lower side the housing 2 comprises a recess 28 extending over the full width of the housing 2. The recess 28 serves to accommodate the middle section 25 of the strip 22 in such a way that the middle section 25 is flush with the adjacent surface of the housing 2.

The terminal tips 26 are twisted in such a way that the side 29 directed to the open end 15 projects further away from the housing 2 than the oppositely directed flatter side 30. When the housing 2 is slid into the cage 3, the flatter side 30 will first contact the cage 3 and the terminal tip 26 will be pushed inwardly until it reaches the opening 27. After the terminal tip 26 snaps into the opening 27 and the most protruding side 29 of the tip 26 blocks any outward movement of the housing 2 from the care 3. The housing 2 can only be released from the cage 3 by pressing the tip 26 inwardly.

FIG. 4 shows an alternative embodiment of a module according to the invention, which is similar to the module 1 of FIG. 1, but which is provided with a different latch 40, which is shown in more detail in FIG. 6. Same parts are indicated with the same reference numbers as in FIGS. 1 and 2. The latch 40 is a sheet metal latch member comprising a square flat body 41 with a laterally extending resilient cantilevered finger 42. The resilient finger 42 carries a triangular upwardly protruding resilient tip 43. The housing 2 is provided with a cavity 44 for accommodating the body 41 in a manner that the body 41 is sunk within the cavity 44 and its upper edge 45 is flush with the adjacent surface of the housing 2. The cavity 44 is extended to allow inward movement of the resilient finger 42 under the action of a pressure force to such extent that the triangular resilient tip 43 is within the cavity 44.

The flat body 41 of the latch member is profiled to have an offset central section 46 extending from the upper edge 45 to a point 47 at a distance before the opposite edge 48. As shown in FIG. 5 the cavity 44 is correspondingly shaped with an offset middle section 49 to form a tight fit with the latch member 40 when the body 41 is inserted within the cavity 44.

The cage 3 is provided with an opening 50 for receiving the triangular resilient tip 43. During assembly of the electronic module 1, the latch member 40 is inserted into the cavity 44 and held by the cavity 44 in a clamping manner. In this position, the triangular resilient tip 43 protrudes from the surface of the housing 2. During insertion of the housing 2 into the cage 3, the tip 43 is pushed into the activity 44. When the opening 50 in the cage 3 is slid over the position of the loaded resilient tip 43, the tip 43 pops up to snap into the opening 50 and to fixate the relative position of the housing 2 and the cage 3. The housing 2 can be removed from the cage 3 by pushing down the resilient tip 43 into the cavity 44. The housing 2 can now be slid out of the cage 3.

The invention claimed is:

1. Electronic module comprising:
a housing,
an electro-conductive cage for shielding the module and a latch for joining the cage to the housing,
wherein the latch comprises a separate latch member accommodated between the housing and the cage, and having at least one resiliently protruding tip, wherein the cage is provided with an opening for receiving the resiliently protruding tip,
wherein the latch member comprises a strip with at least one end bent in a first direction under an angle of more than 90 degrees, the end having a terminal tip which is bent in an opposite direction, wherein the tips of the latch member are at least partly twisted.

2. Electronic module according to claim 1 wherein the housing comprises a recess for accommodating at least a part of the latch member.

3. Electronic module according to claim 2 wherein the latch member and the recess are configured to form a clamping fit.

4. Electronic module according to claim 1, wherein the opening in the cage is arranged in a side wall of the cage.

5. Electronic module according to claim 1 wherein the strip has two ends bent in a first direction under an angle of more than 90 degrees and linked by a middle section having a width corresponding to the width or height of the housing, both of the two ends having a terminal tip which is bent in an opposite direction, wherein the cage comprises two parallel walls for shielding opposite sides of the housing, both walls having an opening for receiving one of the terminal tips of the latch.

6. Electronic module according to claim 5 wherein the middle section of the strip is accommodated in a recess in the housing and is flush with the adjacent surface of the housing.

7. Electronic module comprising:
a housing,
an electro-conductive cage for shielding the module and a latch for joining the cage to the housing,
wherein the latch comprises a separate latch member accommodated between the housing and the cage, and having at least one resiliently protruding tip, wherein the cage is provided with an opening for receiving the resiliently protruding tip,
wherein the latch member comprises a substantially flat body with a laterally extending resilient finger carrying the resilient tip upwardly protruding at a distal end of the resilient finger, wherein the housing is provided with a cavity or accommodating the body and for allowing inward movement of the resilient finger.

8. Electronic module comprising:
a housing,
an electro-conductive cage for shielding the module and a latch for joining the cage to the housing,
wherein the latch comprises a separate latch member accommodated between the housing and the cage, and having at least one resiliently protruding tip, wherein the cage is provided with an opening for receiving the resiliently protruding tip,
wherein the latch member comprises a substantially flat body with a laterally extending resilient finger carrying the resilient tip upwardly protruding at its end, wherein the housing is provided with a cavity or accommodating the body and for allowing inward movement of the resilient finger,
wherein the flat body of the latch member is profiled to have an offset central section extending from an upper edge of the flat body to a point at a distance before the opposite edge, wherein the cavity for accommodating the latch member in the housing is correspondingly shaped to form a tight fit with the latch member.

9. Electronic module according to claim 1 wherein at least the resilient tip of the latch member is made of a metal.

10. Electronic module according to claim 1 wherein the module is a connector module.

11. Electronic module according to claim 10 wherein the connector module is a small footprint pluggable connector module with a housing comprising electronic contacts at a lead end configured to be inserted into the cage; a rear end provided with an optical port.

12. Electronic module comprising:
a housing,
an electro-conductive cage for shielding the module and a latch for joining the cage to the housing,
wherein the latch comprises a separate latch member comprising a strip with two ends bent in a first direction under an angle of more than 90 degrees and linked by a middle section having a width corresponding to the width of the housing, the middle section of the strip being accommodated in a recess in the housing,
wherein both of the two ends have a terminal tip which is bent in an opposite direction, wherein the cage comprises two parallel walls for shielding opposite sides of the housing, both walls having an opening for receiving one of the terminal tips of the strip.

* * * * *